United States Patent [19]
Hong

[11] Patent Number: 5,478,767
[45] Date of Patent: Dec. 26, 1995

[54] METHOD OF MAKING A FLASH EEPROM MEMORY CELL COMPRISING POLYSILICON AND TEXTURED OXIDE SIDEWALL SPACERS

[75] Inventor: Gary Hong, Hsin-Chu, Taiwan

[73] Assignee: United Microelectronics Corporation, Hsinchu, Taiwan

[21] Appl. No.: 315,553

[22] Filed: Sep. 30, 1994

[51] Int. Cl.⁶ .................................................. H01L 21/824
[52] U.S. Cl. .............................................. 437/43; 437/977
[58] Field of Search .................................. 437/43, 48, 52, 437/977; 257/316, 321

[56] References Cited

U.S. PATENT DOCUMENTS

| | | | |
|---|---|---|---|
| 4,274,012 | 6/1981 | Simko | 307/238.3 |
| 4,599,706 | 7/1986 | Guterman | 365/185 |
| 5,063,172 | 11/1991 | Manley | 437/43 |
| 5,101,250 | 3/1992 | Arima et al. | 357/23.5 |
| 5,108,939 | 4/1992 | Manley et al. | 437/43 |
| 5,286,665 | 2/1994 | Muragishi et al. | 437/44 |
| 5,401,993 | 3/1995 | Yamauchi et al. | 257/321 |

FOREIGN PATENT DOCUMENTS

| 6-69516A | 3/1994 | Japan | 437/43 |
|---|---|---|---|

*Primary Examiner*—Olik Chaudhuri
*Assistant Examiner*—Richard A. Booth
*Attorney, Agent, or Firm*—George O. Saile; Graham S. Jones, II

[57] ABSTRACT

A method for fabricating an MOSFET device on a lightly doped semiconductor substrate with a first dielectric layer thereon comprises forming a floating gate layer over the first dielectric layer. The floating gate layer is formed into a floating gate line. A doped source region and a doped drain region in the substrate are formed by ion implantation adjacent to the periphery of the floating gate line. The first dielectric layer is etched, exposing the surface of the substrate and the surface of the source region and the drain region aside from the floating gate line. Textured dielectric spacers are formed about the periphery of the floating gate line. Polycrystalline spacers are formed about the periphery of the polysilicon oxide dielectric spacers in electrical contact with the doped regions. The floating gate layer and the dielectric layer and the polysilicon layer are etched to separate the floating gate line into separate floating gates with the spacers separated, forming a blanket interconductor dielectric layer over the device. A blanket deposit of a conductor layer is formed over the interconductor dielectric layer and a control gate mask on the device is used to pattern the conductor layer by etching away portions of the conductor layer unprotected by the control gate mask.

20 Claims, 11 Drawing Sheets

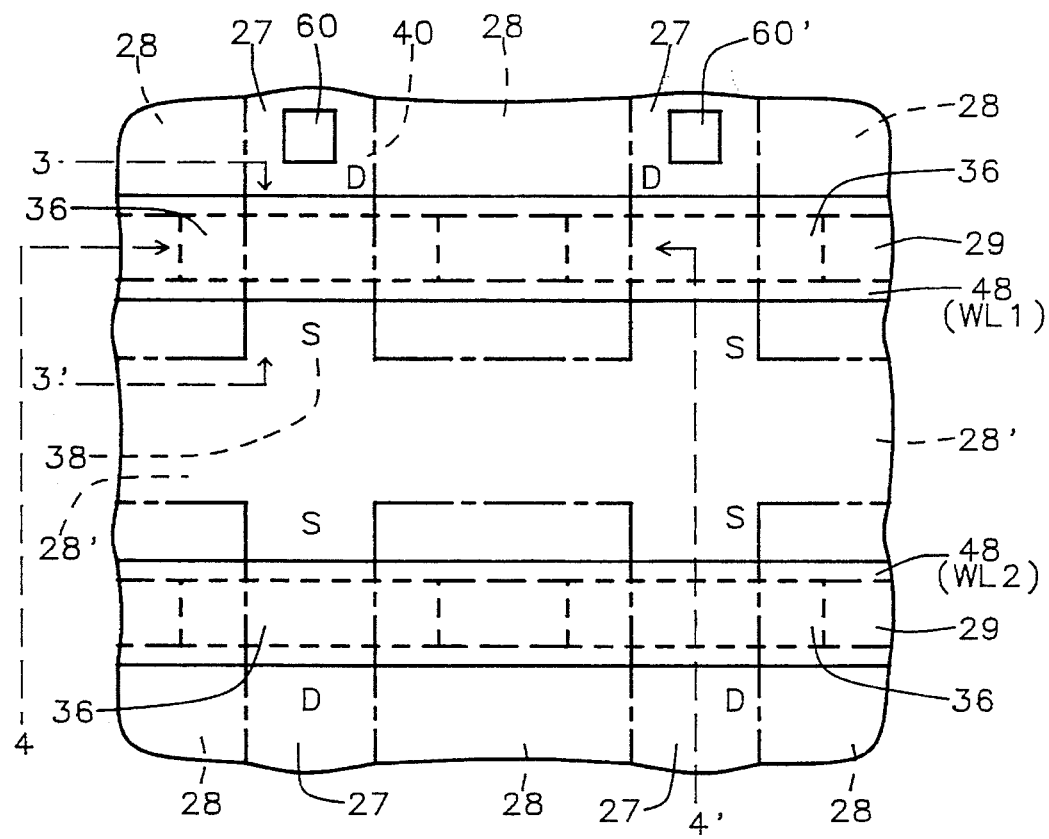
FIG. 1
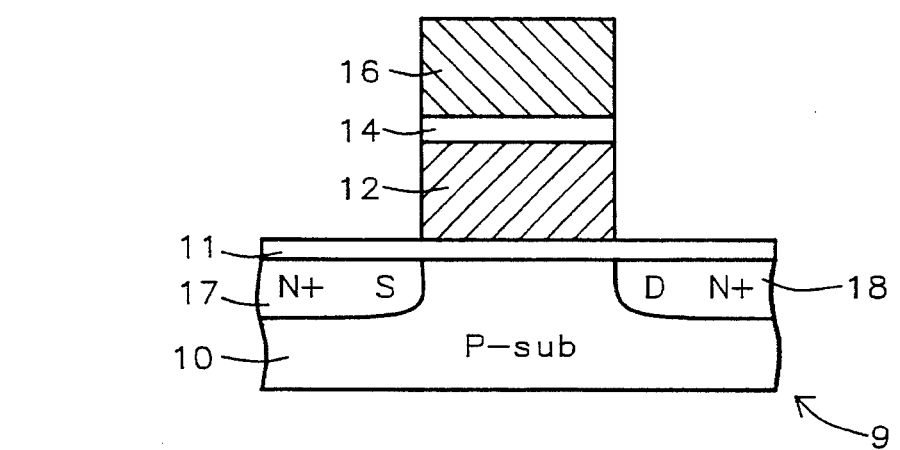
FIG. 2 – Prior Art

METHOD OF MAKING A FLASH EEPROM MEMORY CELL COMPRISING POLYSILICON AND TEXTURED OXIDE SIDEWALL SPACERS

BACKGROUND OF THE INVENTION

1. Field of the Invention

This invention relates to semiconductor memories and more particularly to flash EEPROM cells and the method of manufacture thereof.

2. Description of Related Art

Referring to FIG. 2, a fragmentary sectional view of a prior art EEPROM cell 9 is shown. Cell 9 includes a P– substrate 10 with two spaced apart N+ regions 17 and 18 in the upper surface of substrate 10. The substrate 10 and N+ regions 17 and 18 are covered with a thin tunnel oxide (silicon dioxide) layer 11. A polysilicon 1 floating gate 12 is formed above and in direct contact with the tunnel oxide layer 11. Above the floating gate 12 is a thin ONO three layer dielectric thin film 14. Above the ONO 14 is formed a blanket polysilicon 2 control gate (word line) layer 26. A control gate (polysilicon 2 word line) layer 16 overlies (traverses) the floating gate 12.

The problem with the device of FIG. 2 is that the tunnel oxide 11 needs to be very thin in order to have sufficient tunneling efficiency. Thin tunnel oxide results in reliability and yield problems.

U.S. Pat. No. 5,101,250 of Arima et al for "Electrically Programmable Non-Volatile Memory Device and Manufacturing Method Thereof" shows a process for forming an EEPROM with a conductive (polysilicon) spacers as floating gates, but no polysilicon oxide, etc.

U.S. Pat. No. 5,108,829 of Manley et al for "Method of Making a Non-Volatile Memory Cell Utilizing Polycrystalline Spacer Tunnel Region" shows a process for forming a polysilicon floating gate extension, which differs from the present invention.

SUMMARY OF THE INVENTION

In accordance with this invention, a method is provided for fabricating an MOSFET device on a lightly doped semiconductor substrate with a first dielectric layer thereon comprising forming a floating gate layer over the first dielectric layer, etching the floating gate layer to form a floating gate line, ion implanting a doped source region and a doped drain region in the substrate adjacent to the periphery of the floating gate line, etching the first dielectric layer exposing the surface of the substrate and the surface of the source region and the drain region aside from the floating gate line, forming textured dielectric spacers about the periphery of the floating gate line, forming polycrystalline spacers about the periphery of the polysilicon oxide dielectric spacers in electrical contact with the doped regions, etching the floating gate layer, and the dielectric layer and the polysilicon layer to separate the floating gate line into separate floating gates with the spacers separated, forming a blanket interconductor dielectric layer over the device, forming a blanket deposit of a conductor layer over the interconductor dielectric layer, forming a control gate mask on the device, patterning the conductor layer by etching away portions of the conductor layer unprotected by the control gate mask, and removal of the control gate mask.

Preferably, the textured dielectric comprises polysilicon oxide; the polysilicon oxide has a thickness within a range between about 200 Å and about 500 Å; the textured dielectric has asperities with a height of at least 20 Å; the textured dielectric comprises polysilicon oxide; the polysilicon oxide has a thickness within a range between about 200 Å and about 500 Å; the polysilicon spacers have a thickness within a range between about 500 Å and about 2000 Å; the first polysilicon layer has a thickness within a range from 1000 Å to 4000 Å; the second polysilicon layer has a thickness within a range from 2000 Å to 5000 Å; the polysilicon oxide has a thickness within a range between about 200 Å and about 500 Å;

the polysilicon spacers have a thickness within a range between about 500 Å and about 2000 Å; the first polysilicon layer has a thickness within a range from 1000 Å to 4000 Å; and/or the second polysilicon layer has a thickness within a range from 2000 Å to 5000 Å.

In accordance with another aspect of this invention, a MOSFET device formed on a semiconductor substrate comprises a stack of a first dielectric layer on the substrate, and a floating gate layer over the first dielectric layer, doped source regions and doped drain regions formed in the substrate adjacent to the floating gate, textured dielectric spacers lining the periphery of the floating gate over the doped source regions and the doped drain regions, polysilicon spacers formed juxtaposed with the polysilicon oxide dielectric spacers in electrical contact with the doped regions, a blanket dielectric layer over the floating gate, the spacers and the device, and a control gate formed over the dielectric layer above the floating gate.

Preferably, the textured dielectric comprises polysilicon oxide; the polysilicon oxide has a thickness within a range between about 200 Å and about 500 Å; the textured dielectric has asperities with a height of at least 20 Å; the textured dielectric comprises polysilicon oxide; the polysilicon oxide has a thickness within a range between about 200 Å and about 500 Å and having asperities with a height of between 20 Å and about 80 Å; the polysilicon spacers have a thickness within a range between about 500 Å and about 2000 Å and the first polysilicon layer has a thickness within a range from 1000 Å to 4000 Å.

In accordance with another aspect of this invention, a method is provided for fabricating a MOSFET device on a lightly doped semiconductor substrate with a first dielectric layer thereon comprising forming a polysilicon floating gate layer over the first dielectric layer, etching the polysilicon floating gate layer to form a polysilicon floating gate line, ion implanting a doped source region and a doped drain region in the substrate adjacent to the periphery of the polysilicon floating gate line, etching the first dielectric layer exposing the surface of the substrate and the surface of the source region and the drain region aside from the polysilicon floating gate line, forming textured dielectric spacers composed of polysilicon oxide about the periphery of the polysilicon floating gate line, the textured dielectric having asperities with a height of at least 20 Å, forming polysilicon spacers about the periphery of the polysilicon oxide dielectric spacers in electrical contact with the doped regions, etching the polysilicon floating gate layer, and the dielectric layer and the polysilicon layer to separate the polysilicon floating gate line into separate polysilicon floating gates with the spacers separated, forming a blanket ONO layer over the device, forming a blanket deposit of a doped polysilicon 3 conductor layer over the ONO layer, forming a control gate mask on the device, patterning the polysilicon 3 conductor layer by etching away portions of the polysilicon 3 conductor layer unprotected by the control gate mask, and removal of the control gate mask.

Preferably the textured dielectric comprises polysilicon oxide; the polysilicon oxide has a thickness within a range between about 200 Å and about 500 Å; the asperities have a height between about 20 Å and 80 Å; the textured dielectric comprises polysilicon oxide; the polysilicon oxide has a thickness within a range between about 200 Å and about 500 Å; the polysilicon spacers have a thickness within a range between about 500 Å and about 2000 Å; the first polysilicon layer has a thickness within a range from 1000 Å to 4000 Å; the second polysilicon layer has a thickness within a range from 2000 Å to 5000 Å; the polysilicon oxide has a thickness within a range between about 200 Å and about 500 Å and having asperities with a height of between 20 Å and about 80 Å; the polysilicon spacers have a thickness within a range between about 500 Å and about 2000 Å; the first polysilicon layer has a thickness within a range from 1000 Å to 4000 Å; and/or the second polysilicon layer has a thickness within a range from 2000 Å to 5000 Å.

BRIEF DESCRIPTION OF THE DRAWINGS

The foregoing and other aspects and advantages of this invention are explained and described below with reference to the accompanying drawings, in which:

FIG. 1 shows a plan view of an EEPROM device 30 made in accordance with this invention.

FIG. 2, shows a fragmentary sectional view of a prior art EEPROM cell.

DESCRIPTION OF THE PREFERRED EMBODIMENT

This invention provides a structure and a process sequence for producing a flash EEPROM memory device.

FIG. 1 shows a plan view of an EEPROM device 30 made in accordance with this invention. FIGS. 3A–3K show a cross-sectional view taken along line 3–3' of a fragment of the device of FIG. 1 illustrating the process flow during the manufacture of a device 30. FIGS. 4A–4K show a different cross-sectional view taken along line 4–4' of a fragment of the device of FIG. 1 illustrating the process flow during the manufacture of a device 30.

Figure 3A:
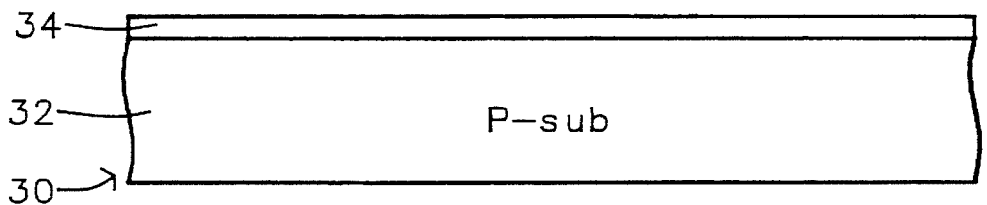
FIGS. 3A–3K show a cross-sectional view taken along line 3–3' of a fragment of the device of FIG. 1 illustrating the process flow during the manufacture of the device.
Figure 3B:
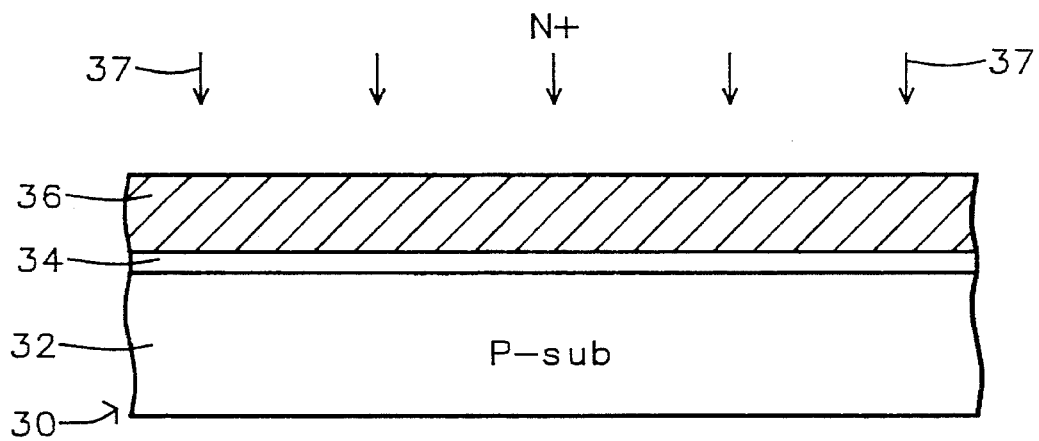
Figure 3C:
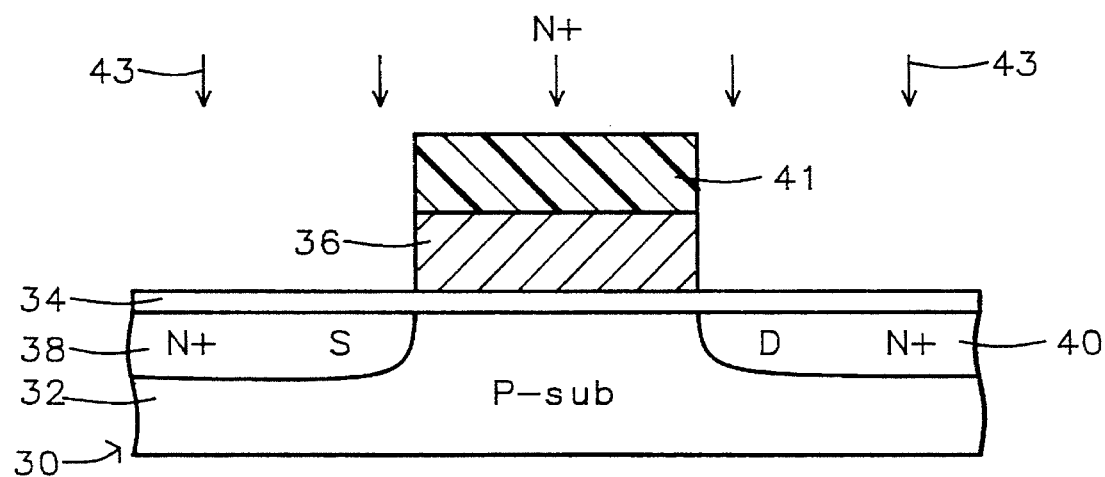
Figure 3D:
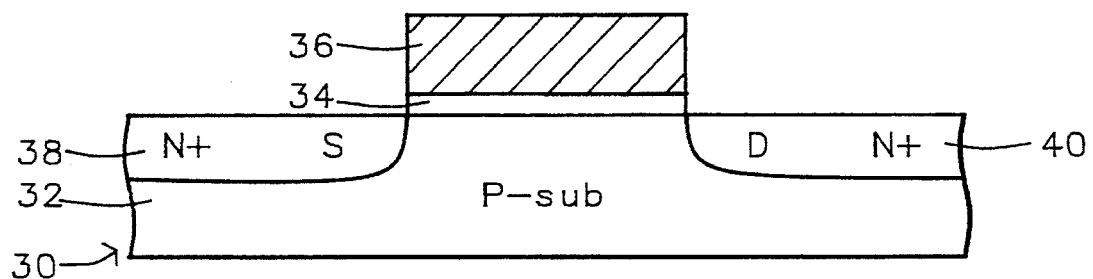
Figure 3E:
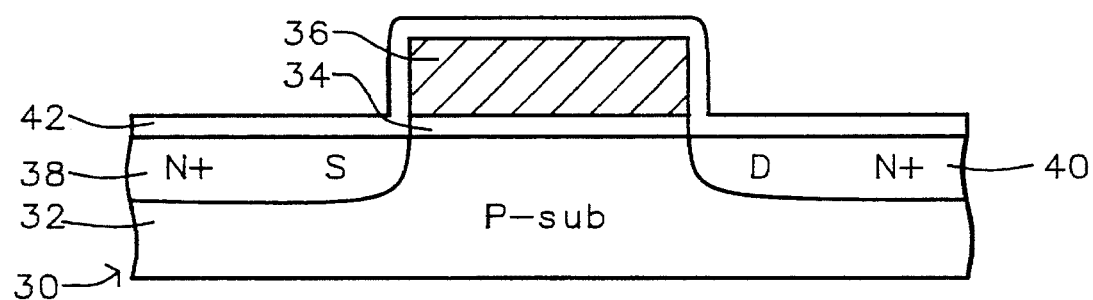
Figure 3F:
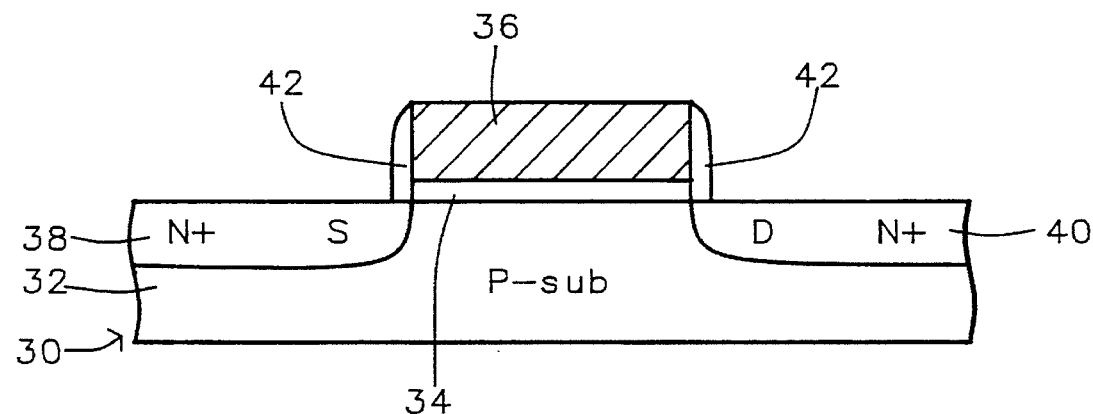
Figure 3G:
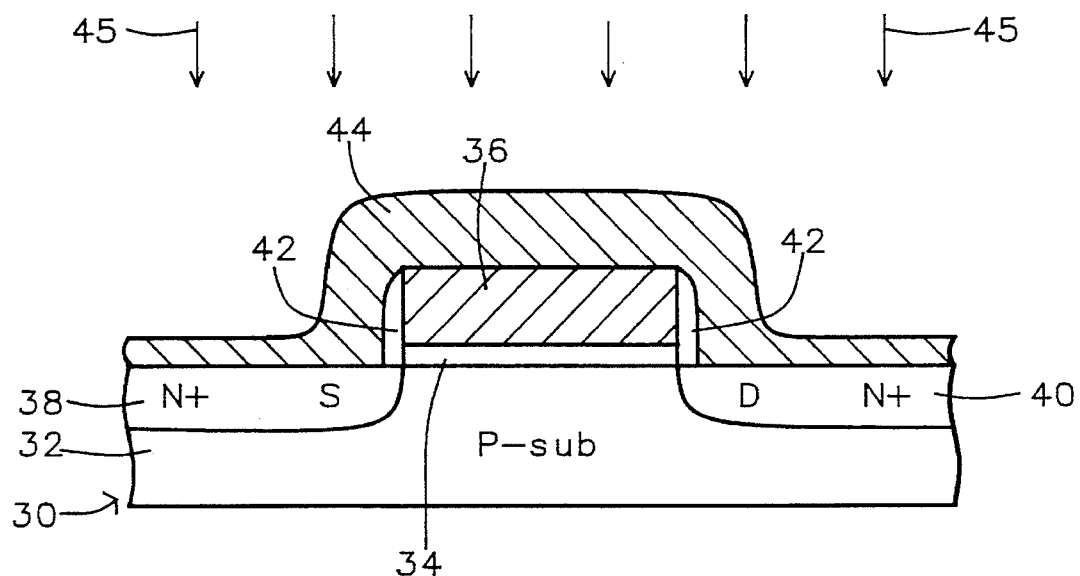
Figure 3H:
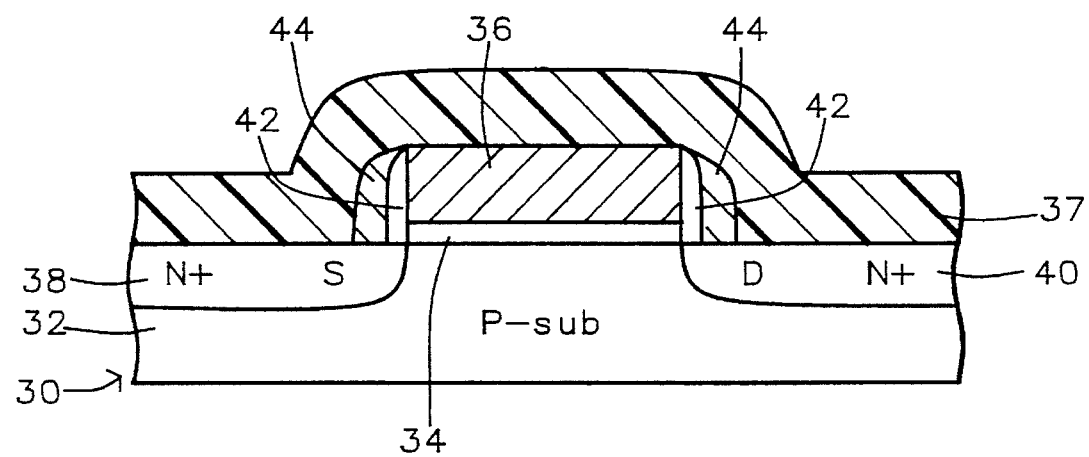
Figure 3I:
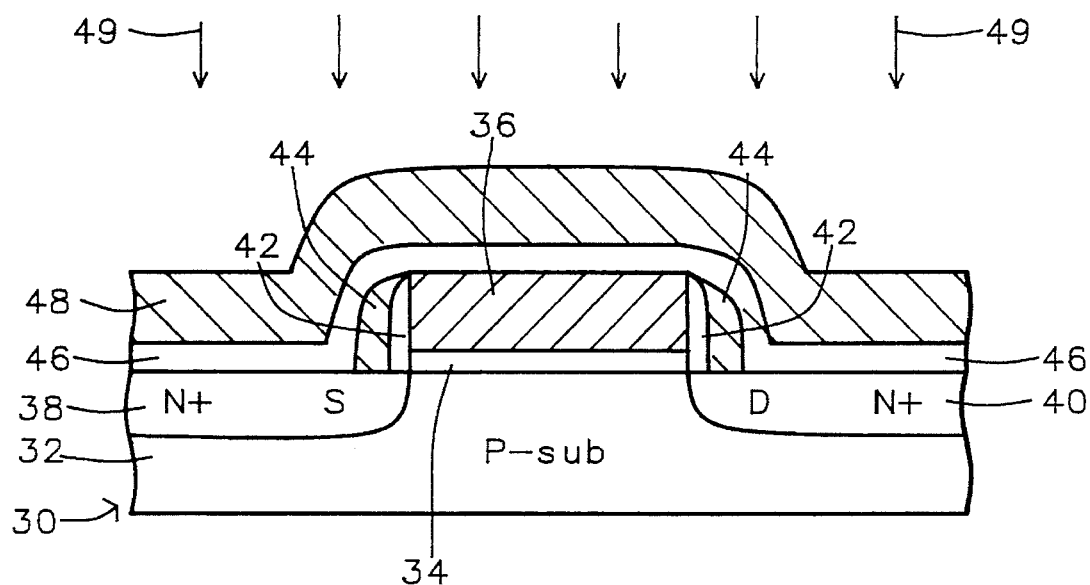
Figure 3J:
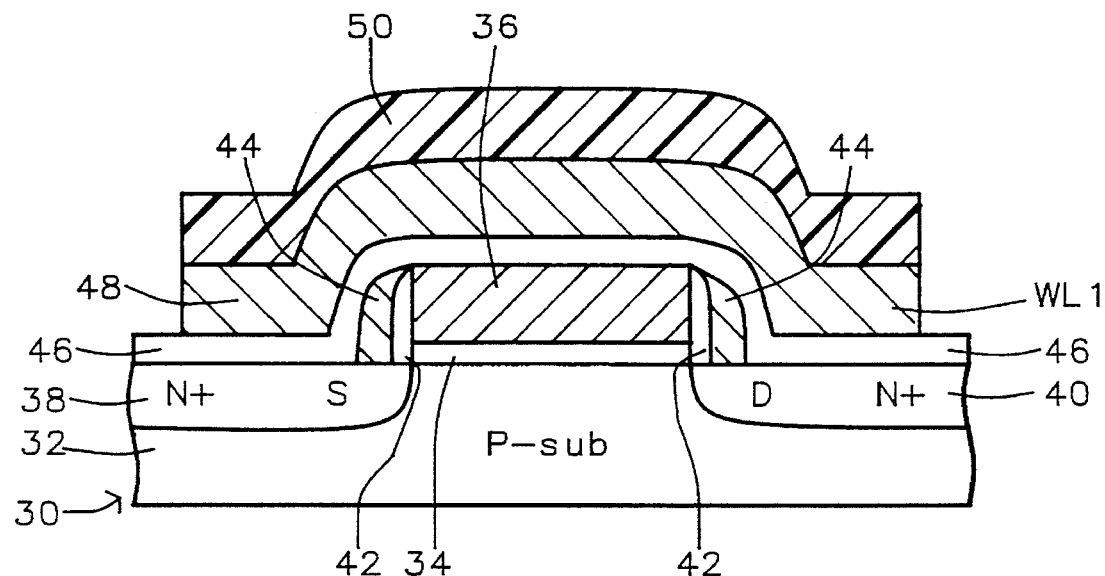
Figure 3K:
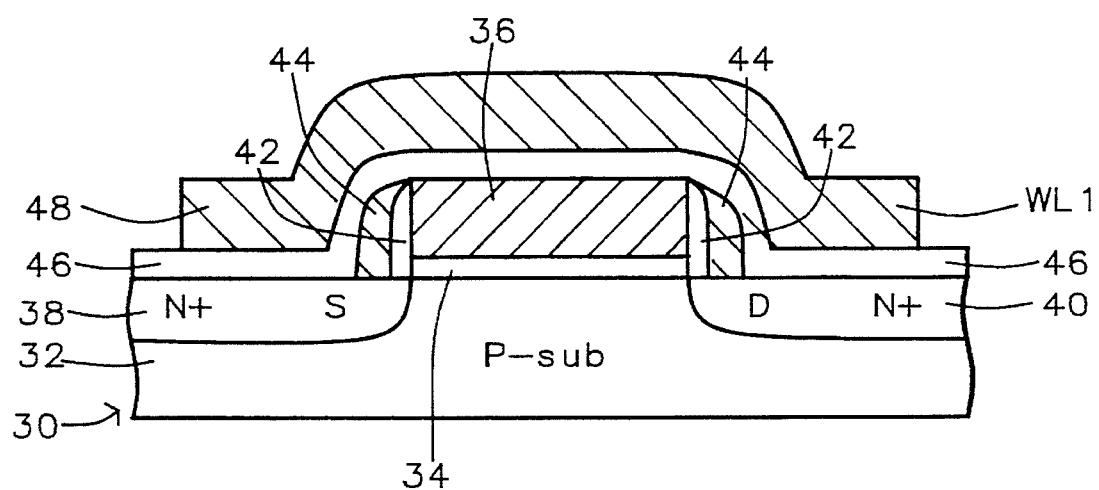
Figure 4A:
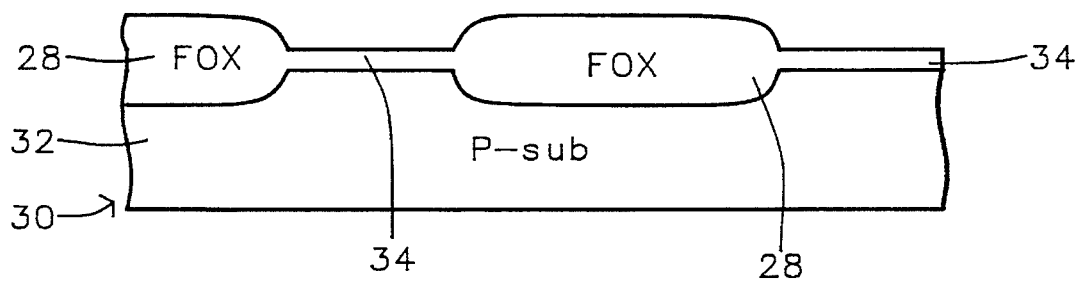
FIGS. 4A–4K show a different cross-sectional view taken along line 4–4' of a fragment of the device of FIG. 1 illustrating the process flow during the manufacture of the device.
Figure 4B:
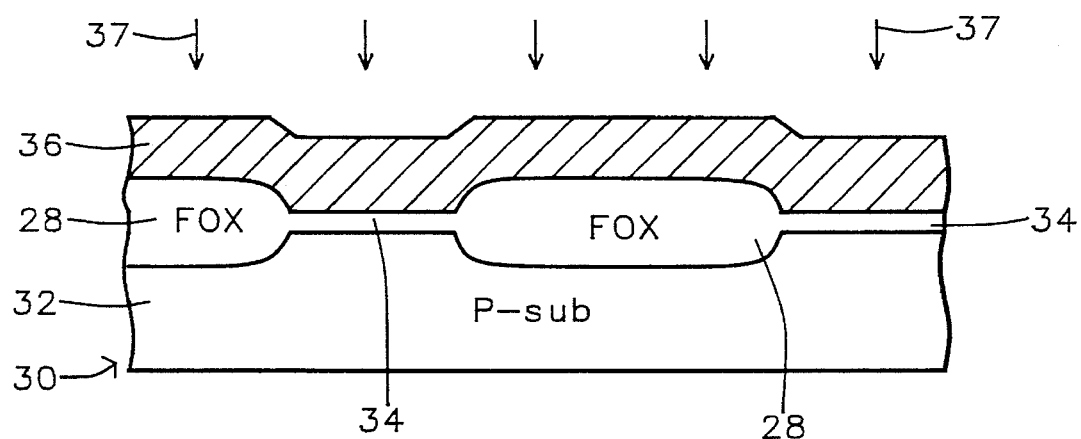
Figure 4C:
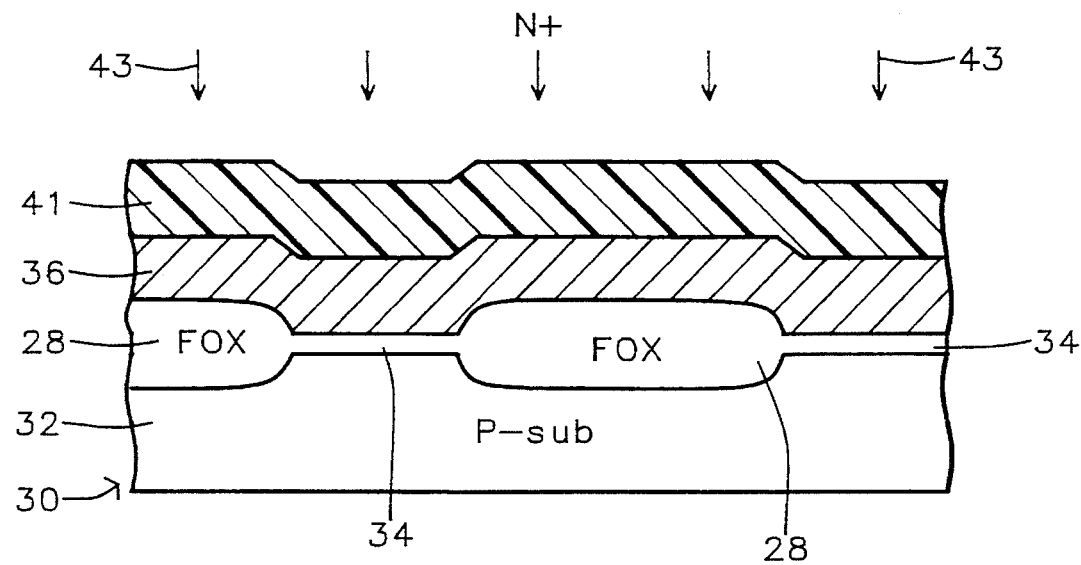
Figure 4D:
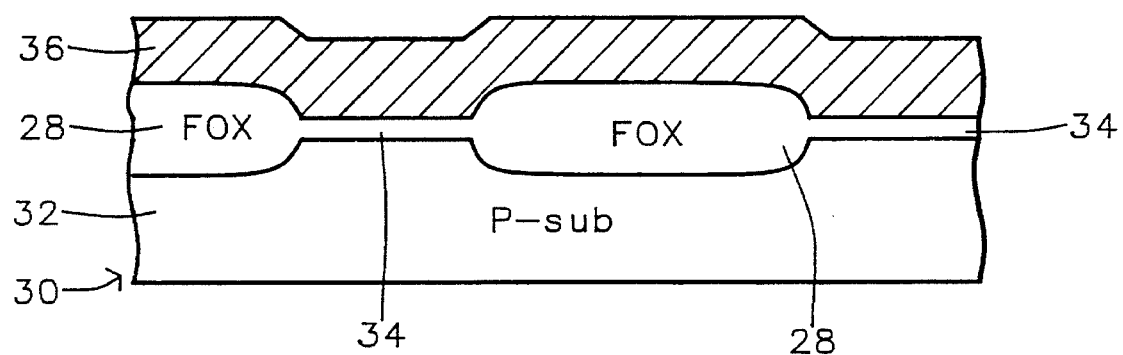
Figure 4E:
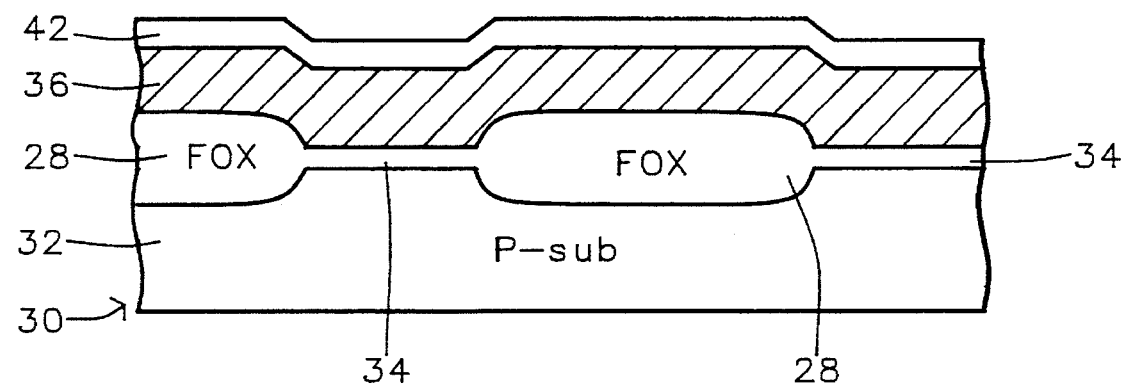
Figure 4F:
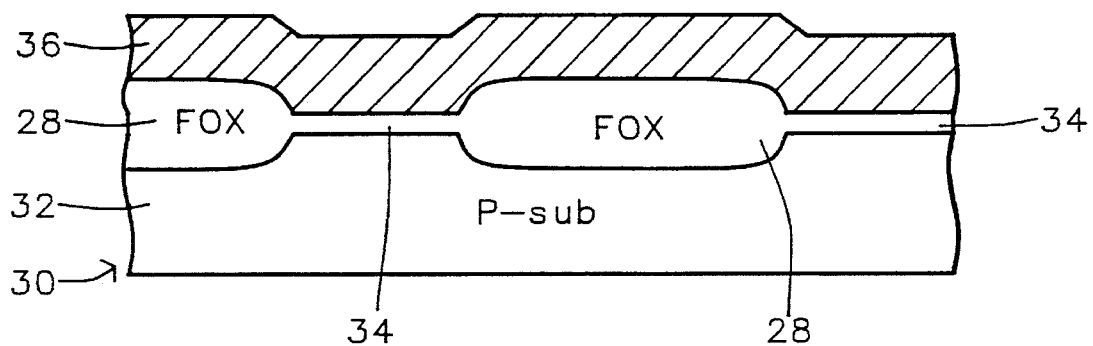
Figure 4G:
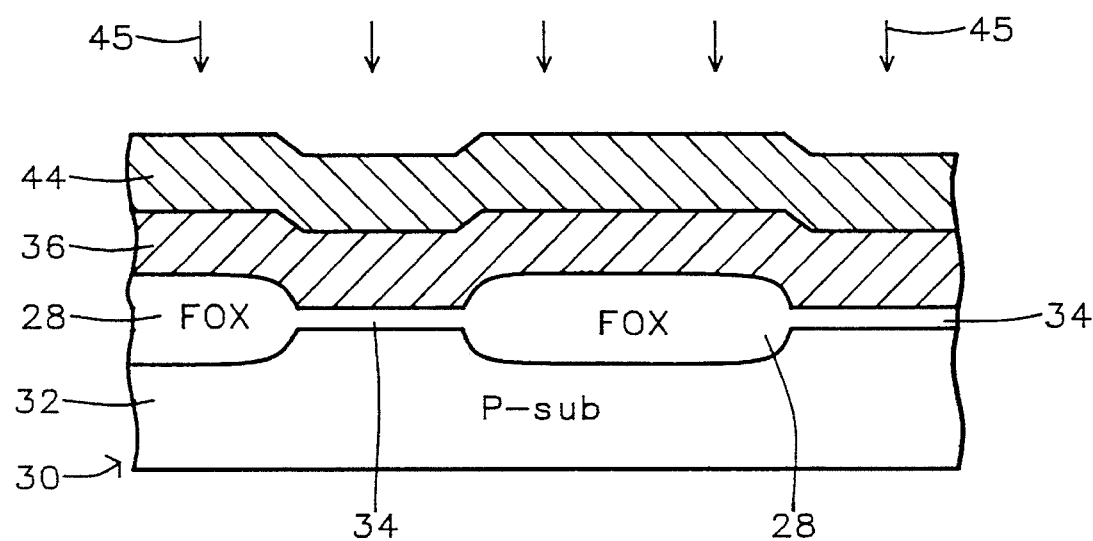
Figure 4H:
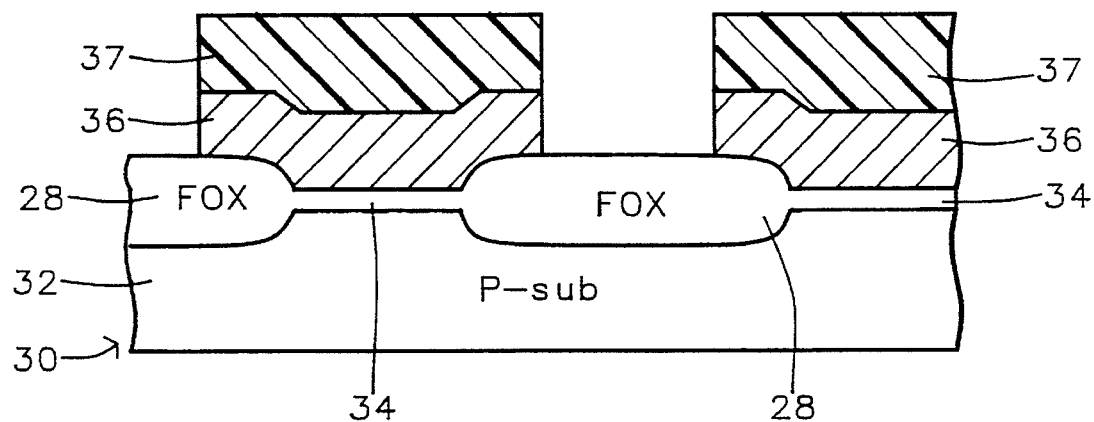
Figure 4I:
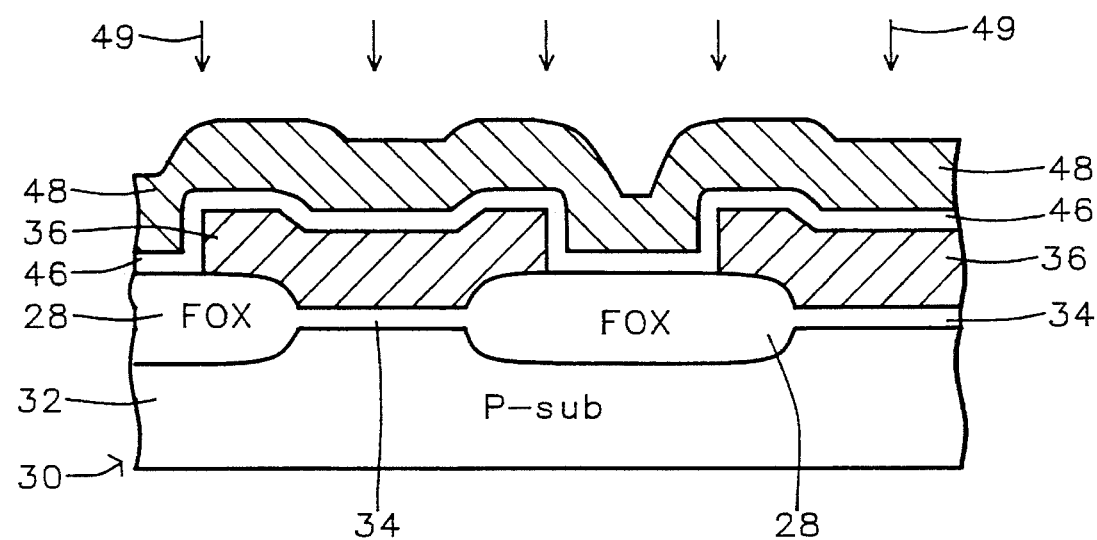
Figure 4J:
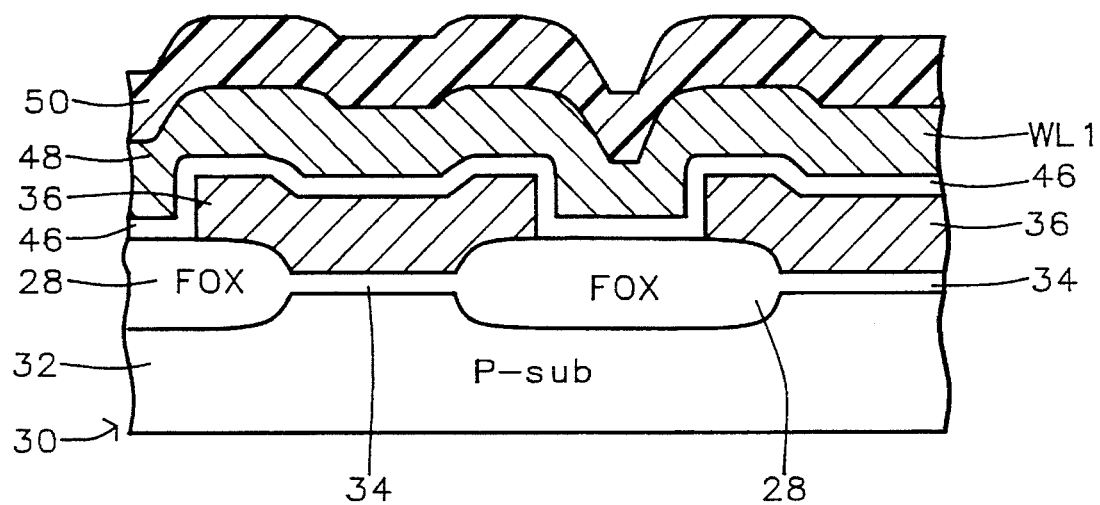
Figure 4K:
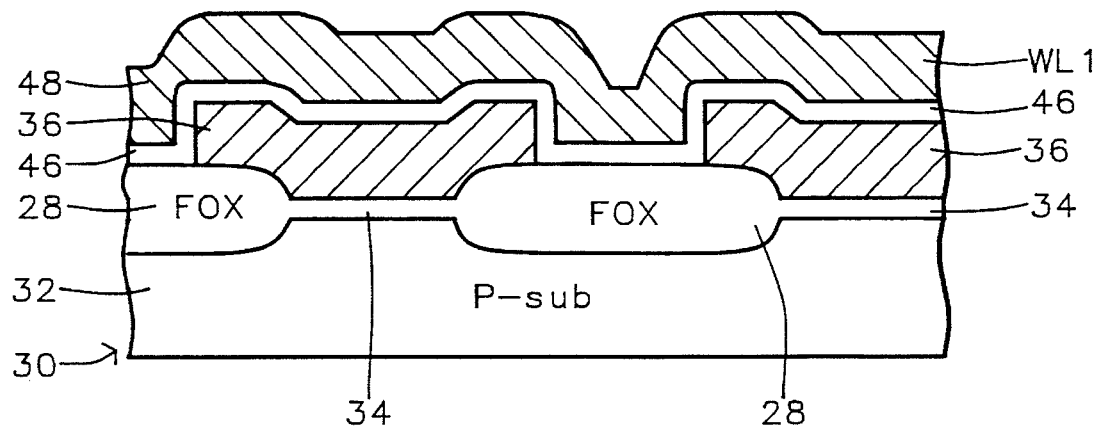

Referring to FIGS. 3K and 4K, device 30 is formed on a silicon substrate 32 with N+ source/drain regions 38/40 gate oxide layer 34, and polysilicon 1 floating gate 36. Referring to FIG. 1, active regions 28 have been formed in the P– semiconductor substrate 32. Active regions 27 have been formed in P-substrate 32. Polysilicon 1 floating gates 36 and polysilicon 3 control gates 48 are formed on the device 30.

Adjacent to the floating gate 36 in FIG. 3K the gate oxide layer 34 has been removed and dielectric spacers 42 have been formed. Then adjacent to the dielectric spacers, polysilicon 2 spacers 44 have been formed shorted to the source/drain 38/40. Above the entire device a blanket layer 46 of ONO dielectric has been formed, upon which polysilicon 3 word lines 48 (WL1 and WL2) have been formed as seen in FIG. 2, FIG. 3K, and FIG. 4K.

PROCESS

Referring to FIGS. 3A and 4A, a fragment of a device 30 made in accordance with this invention is shown in the early stages of manufacture thereof.

In the early stages of fabrication in accordance with the method of this invention, a P– doped silicon substrate 32 is produced by a conventional doping process, with conventional formation of the active area of the device by photolithographic patterning to perform a conventional LOCOS process for a flash EEPROM memory cell followed by formation of field oxide (FOX) 28 by a conventional thermal oxidation process to a thickness of about 5,000 Å.

Gate Oxidation

By the conventional process of gate oxidation the remainder of substrate 32 (not covered by FOX 28) is covered with a blanket of a first dielectric layer (silicon dioxide) layer 34 having a preferred thickness within a range between about 200 Å and about 300 Å in accordance with a the conventional process of of growing the gate oxide is thermal oxidation in dry $O_2$ and $N_2$ (e.g. 850° C. for 30 minutes.)

Floating Gate Deposition and Doping

Then, referring to FIGS. 3B and 4B, a blanket, floating gate, polysilicon 1 layer 36 is deposited to a preferred range of thicknesses between about 500 Å and about 3,000 Å by the conventional LPCVD (low pressure chemical vapor deposition) process.

Subsequently, the polysilicon 1 layer 36 is doped by ion implantation. The arsenic (As) dopant 37 is applied with a dose within a range between about $1 \times 10^{14}/cm^2$ and about $5 \times 10^{15}/cm^2$ within a range of energies between about 30 keV and about 100 keV.

Masking and Etching Floating Gate Line

Referring to FIGS. 3C and 4C, a photoresist mask 41 was formed over the layer 36 and mask 41 as seen in FIGS. 3C and 4E, with the floating gates 36 extending across the entire section at this stage of the process in FIG. 4C, which is a section taken along the length of the floating gate and the word line WL1 (layer 48).

Next, as shown in FIGS. 1, 3C, and 4C, the polysilicon 1 layer 36 has been etched using a conventional etchant patterned to form layer 36 into floating gate lines in the shape of parallel lines of intermediate patterns comprising elongated lines 36, shaped by mask 41. Later, in FIGS. 4H, the gates 36 are shown after they have been separated to separate the spacers from sources and drains for each device.

N+ Source/Drain Ion Implant

Then N+ S/D (source/drain) arsenic (As) dopant 43 is implanted into regions 38, 40 below the exposed surfaces of gate oxide 34 in the P-substrate 32. The implantation of As ions 43 is performed with an energy of about 50 keV. A dose of As ions 43 of about $5\times10^{15}/cm^2$ is preferred.

Gate Oxide Etch

Then as shown in FIG. 3D, the portions of the device not covered by floating gate layer 36 is etched away in a wet etch with BHF (buffered hydrofluoric acid) in the conventional manner.

Formation of Polysilicon Oxide

Next, as shown in FIGS. 3E and 4E a blanket polysilicon oxide layer 42 is formed on all the exposed surfaces of the device 30 by means of the process of thermal oxidation under around 850° C., $O_2/N_2$ mixture ambient conditions The polysilicon oxide layer 42 comprises a textured oxide including asperities. The asperities having a height within a range between 20 Å and about 80 Å. Polysilicon oxide layer 42 has a thickness within a range of thicknesses between about 200 Å and about 500 Å. The asperity of the surface of polysilicon oxide layer 42 (textured material) is formed by thermally oxidizing the polysilicon 1 layer 36. The polysilicon oxide layer 42 has a different growth rate over the surface of polysilicon 1 layer 36 due to the grain boundaries of the polysilicon 1 layer 36. Therefore, the polysilicon oxide has asperities as is known by those skilled in the art.

Anisotropic Etch Back

FIG. 3F shows spacer structures 42 formed from textured polysilicon oxide layer 42 by means of an anisotropic plasma etching process to form spacers 42 (with the asperities described above) adjacent to the floating gate 36 and the remainder of gate oxide layer 34. The entire layer 42 is removed from the top surfaces of the floating gate layer 36.

polysilicon 2 Deposition and Doping

Then, referring to FIGS. 3G and 4G, a blanket polysilicon 2 layer 44 is deposited to a range of thicknesses between about 500 Å and about 2,000 Å by the conventional LPCVD (low pressure chemical vapor deposition) process.

Polysilicon 2 layer 44 is doped with a dopant 45 of phosphoryl chloride ($POCl_3$) at 900° C. for 20 minutes or ion implantation. The arsenic (As) dopant 45 is applied with a dose within a range between about $1\times10^{15}/cm^2$ and about $1\times10^{16}/cm^2$ within a range of energies between about 30 keV and about 100 keV.

Anisotropic Etch Back

FIGS. 3H and 4H show the device of FIGS. 3G and 4G after etching of polysilicon 2 layer 44 to form spacers 44. The etching process comprises a conventional anisotropic plasma etching process to form spacers 44 adjacent to the silicon dioxide spacers 42 in direct electrical and mechanical contact with source/drain regions 38 and 40, i.e. the source/drain regions are short circuited to the polysilicon 2 spacers 44.

As seen in FIG. 4H all of layer 44 was removed from the top surfaces of the floating gate layer 36.

Masking and Etching Floating Gate

Referring to FIGS. 3H and 4H, a photoresist mask 37 is formed over the polysilicon 1 layer 36 and polysilicon 2 layer 44. The mask 37 was patterned to prepare for etching to separate the elongated floating gate strips 36 into individual floating gates 36 as seen in FIG. 4H.

Next, mask 37 was used as the polysilicon 1 layer 36 was etched using a conventional etchant to form the separate floating gates 36 as shaped by mask 37. By this process as seen in FIGS. 4H, the gates 36 are shown after they have been separated to isolate the polysilicon 2 spacers 44 from the sources 38 and drains 40 for each device.

Interconductor Dielectric (Interpolysilicon ONO)

Referring to FIGS. 3I and 4I, the product of FIGS. 3H and 4H is shown after the formation of a dielectric interpolysilicon sandwich in the form of a thin film 46 (e.g. ONO) with an thickness of ONO preferably of about 200 Å applied to the exposed surfaces of the device of FIG. 3H and FIG. 4H by means of the conventional process. A range of thickness between about 100 Å and about 300 Å is possible.

Control Gate Deposition and Doping

Then, referring again to FIGS. 3I and 4I, a blanket, polysilicon 3 conductor layer 48 is deposited to a preferred range of thicknesses between about 1,000 Å and about 5,000 Å by the conventional LPCVD (low pressure chemical vapor deposition) process.

Subsequently, the polysilicon 3 conductor layer 48 is doped by a conventional method such as implantation with ions 49. An alternative to polysilicon 3 is polycide (polysilicon plus silicide) as is well known by those skilled in the art.

Control Gate (Word Line) Masking and Etching

Referring to FIGS. 3J and 4J, a photoresist mask 50 was formed over the polysilicon 3 conductor layer 48. Mask 50 is patterned in the form of word lines and control gates in the conventional manner. Then the polysilicon 3 layer 48 is etched accordingly using a conventional etchant and the mask 50 to pattern the polysilicon 3 conductor layer 48.

Referring to FIGS. 3K and 4K the photoresist mask 50 has been stripped from the device 30 by any well known conventional process.

Back end process

Conventional back end process steps follow including depositions of a glass (BPSG) layer, flow, contact formation, metallization and passivation.

Operation of Device

To program the cell, the operations are as follows:

| | |
|---|---|
| Control gate high voltage | About 12 V |
| Drain | About 5 V–6 V |
| Source | Ground |

The electrons required to operate the device can be injected into polysilicon 1 floating gate from drain junction by use of channel hot electrons.

Also the cell can be programmed by using Fowler-Nordheim (F-N) tunnelling between the polysilicon 2 spacers 44 and the polysilicon 1 floating gate 36. The polysilicon 2 spacer on the drain side is shorted to the drain 40/32 junction. Therefore, by placing a high potential (about 15 Volts at the Control Gate 48) and grounding the drain 40, the electrons can be injected through the polysilicon oxide layer 46 (textured polysilicon oxide) to the polysilicon 1 floating gate 36. To erase, the electrons of the floating gate 36 can be pulled out through the polysilicon oxide at the source side to source Junction by applying a potential difference between the source 38 and the control gate 48.

In the conventional flash memory cell as shown in FIG. 2, the electrons tunnel through a thin gate oxide layer 11 (less than or equal to 100 Å.) In accordance with this invention, by using a thicker polysilicon 1 tunnel oxide (200 Å–500 Å) between the floating gate (polysilicon 1) and polysilicon 2 spacers that are shorted to the source/drain, the tunneling operations can be accomplished. Tunneling through a relatively thick inter-polyoxide is made possible by the locally enhanced field from the asperities on the surface of the polysilicon 1 floating gate. Since the tunnel oxide is much thicker, the polysilicon oxide is more reliable. U.S. Pat. No. 4,274,012 and U.S. Pat. No. 4,599,706 describe examples of use of polysilicon oxide as a tunnel dielectric.

This invention is adapted for use in Flash EEPROM memory devices.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an EPROM device on a lightly doped semiconductor substrate comprising forming a silicon dioxide gate oxide layer having a thickness of between about 200 Å and about 300 Å over said substrate, forming a floating gate layer over said gate oxide layer, forming a floating gate mask over said floating gate layer protecting portions thereof and etching portions of said floating gate layer not protected by said mask to form a floating gate line, ion implanting a doped source region and a doped drain region in said substrate adjacent to the periphery of said floating gate line, etching said gate oxide layer exposing the surface of said substrate and the surface of said source region and said drain region adjacent to the periphery said floating gate line, forming textured dielectric spacers about the periphery of said floating gate line having a thickness between about 200 Å and about 500 Å, said dielectric spacers having asperities with a height greater than 20 Å, said dielectric spacers being in electrical and mechanical contact with said doped source and drain regions respectively, forming polycrystalline spacers about the periphery of said textured dielectric spacers in electrical contact with said doped regions, forming a blanket interconductor dielectric layer over said floating gate line, blanket depositing a control gate conductor layer over said interconductor dielectric layer, forming a control gate mask on said device, patterning said conductor layer by etching away portions of said conductor layer unprotected by said control gate mask, and removal of said control gate mask.

2. A method in accordance with claim 1 wherein said textured dielectric comprises polysilicon oxide.

3. A method in accordance with claim 1 wherein said textured dielectric has asperities with a height between about 20 Å and about 80 Å.

4. A method in accordance with claim 3 wherein said textured dielectric comprises polysilicon oxide.

5. A method in accordance with claim 4 wherein said polycrystalline spacers have a thickness within a range between about 500 Å and about 2000 Å.

6. A method in accordance with claim 5 wherein said floating gate layer comprises a polysilicon layer which has a thickness within a range from 500 Å to 3,000 Å.

7. A method in accordance with claim 6 wherein said control gate conductor layer has a thickness within a range from 1,000 Å to 5,000 Å.

8. A method in accordance with claim 1 wherein said textured dielectric spacers comprise polysilicon oxide which has a thickness within a range between about 200 Å and about 500 Å, wherein said floating gate layer comprises polysilicon and said polysilicon oxide is formed by thermally oxidizing said floating gate layer.

9. A method in accordance with claim 8 wherein said floating gate layer comprises a polysilicon layer that has a thickness within a range from 500 Å to 3,000 Å.

10. A method in accordance with claim 9 wherein said conductor layer has a thickness within a range from 1,000 Å to 5,000 Å.

11. A method of fabricating an EPROM device on a lightly doped semiconductor substrate comprising forming a silicon dioxide gate oxide layer having a thickness of between about 200 Å and about 300 Å over said substrate, forming a doped polysilicon floating gate layer over said gate oxide layer, etching said polysilicon floating gate layer to form a polysilicon floating gate line, ion implanting a doped source region and a doped drain region in said substrate adjacent to the periphery of said polysilicon floating gate line, etching said gate oxide layer exposing the surface of said substrate and the surface of said source region and said drain region adjacent to the periphery said polysilicon floating gate line, forming polysilicon oxide textured dielectric spacers about the periphery of said polysilicon floating gate line over said source and drain regions respectively, said textured dielectric spacers having asperities with a height of at least 20 Å and having a thickness between about 200 Å and about 500 Å said dielectric spacers being in electrical and mechanical contact with said doped source and drain regions respectively, forming polysilicon spacers about the periphery of said polysilicon oxide textured dielectric spacers in electrical contact with said doped regions, forming a blanket ONO layer over said floating gate line, forming a blanket deposit of a doped polysilicon conductor layer over said ONO layer, forming a control gate mask on said device, patterning said polysilicon conductor layer by etching away portions of said polysilicon 3 conductor layer unprotected by said control gate mask, and removal of said control gate mask.

12. A method in accordance with claim 11 wherein said textured dielectric comprises polysilicon oxide and said polysilicon oxide is formed by thermally oxidizing said doped polysilicon floating gate layer.

13. A method in accordance with claim 11 wherein said asperities have a height between about 20 Å and 80 Å.

14. A method in accordance with claim 13 wherein said polysilicon spacers have a thickness within a range between about 500 Å and about 2000 Å.

15. A method in accordance with claim 14 wherein said first polysilicon layer has a thickness within a range from 500 Å to 3,000 Å.

16. A method in accordance with claim 15 wherein said second polysilicon layer has a thickness within a range from 2000 Å to 5000 Å.

17. A method in accordance with claim 11 wherein said polysilicon spacers have a thickness within a range between about 500 Å and about 2000 Å.

18. A method in accordance with claim 17 wherein said floating gate layer comprises a polysilicon layer which has a thickness within a range from 500 Å to 3,000 Å.

19. A method in accordance with claim 18 wherein said conductor layer has a thickness within a range from 1,000 Å to 5,000 Å.

20. A method of fabricating an EPROM device on a lightly doped semiconductor substrate layer thereon comprising forming a silicon dioxide gate oxide layer having a thickness of between about 200 Å and about 300 Å over said substrate, forming a doped polysilicon floating gate layer over said gate oxide layer, said first polysilicon layer having a thickness within a range from 500 Å to 3,000 Å and having a top surface, etching said polysilicon floating gate layer to form a polysilicon floating gate line, ion implanting a doped source region and a doped drain region in said substrate adjacent to the periphery of said polysilicon floating gate line, etching said gate oxide layer exposing the surface of said substrate and the surface of said source region and said drain region adjacent to the periphery of said polysilicon floating gate line, forming polysilicon oxide textured dielectric spacers about the periphery of said polysilicon floating gate line over said source and drain regions respectively, said textured dielectric spacers having asperities with a height between about 20 Å and about 80 Å and having a thickness between about 200 Å and about 500 Å, said dielectric spacers being in electrical and mechanical contact with said doped source and drain regions respectively, said textured dielectric comprises polysilicon oxide and said polysilicon oxide is formed by thermally oxidizing said floating gate layer followed by an anisotropic etching process removing the polysilicon oxide from the top surfaces of said floating gate layer, forming polysilicon spacers about the periphery of said polysilicon oxide textured dielectric spacers in electrical contact with said doped regions, said polysilicon spacers having a thickness within a range between about 500 Å and about 2000 Å, forming a blanket ONO layer over said floating gate line, forming a blanket deposit of a doped polysilicon control gate layer over said ONO layer having a thickness between about 1,000 Å and about 5,000 Å, forming a control gate mask on said doped control gate layer, patterning said control gate layer by etching away portions of said control gate layer unprotected by said control gate mask, and removal of said control gate mask.

\* \* \* \* \*